United States Patent
Dang et al.

(10) Patent No.: US 8,328,156 B2
(45) Date of Patent: Dec. 11, 2012

(54) TECHNIQUES FOR FORMING SOLDER BUMP INTERCONNECTS

(75) Inventors: Bing Dang, Chappaqua, NY (US); Peter A. Gruber, Mohegan Lake, NY (US); Luc Guerin, Quebec (CA); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/371,840

(22) Filed: Feb. 13, 2012

(65) Prior Publication Data
US 2012/0138769 A1 Jun. 7, 2012

Related U.S. Application Data

(62) Division of application No. 11/856,831, filed on Sep. 18, 2007, now Pat. No. 8,148,255.

(51) Int. Cl.
*B28B 7/22* (2006.01)
*E04G 11/50* (2006.01)
(52) U.S. Cl. .................. 249/60; 249/117; 257/E21.586
(58) Field of Classification Search .................. 257/737, 257/E21.586; 249/60
See application file for complete search history.

(56) References Cited

U.S. PATENT DOCUMENTS

| | | | |
|---|---|---|---|
| 5,244,143 A | 9/1993 | Ference et al. | |
| 5,607,099 A * | 3/1997 | Yeh et al. | 228/180.22 |
| 5,643,831 A * | 7/1997 | Ochiai et al. | 438/616 |
| 5,775,569 A | 7/1998 | Berger et al. | |
| 5,959,346 A * | 9/1999 | Ochiai | 257/618 |
| 6,025,258 A * | 2/2000 | Ochiai et al. | 438/613 |
| 6,090,301 A * | 7/2000 | Mizukoshi et al. | 216/17 |
| 6,105,852 A | 8/2000 | Cordes et al. | |
| 6,133,633 A | 10/2000 | Berger et al. | |
| 6,149,122 A | 11/2000 | Berger et al. | |
| 6,271,110 B1 * | 8/2001 | Yamaguchi et al. | 438/613 |
| 6,319,810 B1 * | 11/2001 | Ochiai et al. | 438/616 |
| 6,340,630 B1 * | 1/2002 | Berger et al. | 438/613 |
| 6,390,439 B1 | 5/2002 | Cordes et al. | |
| 6,415,504 B1 * | 7/2002 | Matsuda | 29/846 |
| 6,528,346 B2 * | 3/2003 | Ochiai et al. | 438/108 |
| 6,709,966 B1 * | 3/2004 | Hisatsune et al. | 438/613 |
| 2002/0014703 A1 * | 2/2002 | Capote et al. | 257/778 |
| 2004/0166663 A1 * | 8/2004 | Kline | 438/616 |
| 2005/0085063 A1 * | 4/2005 | Akram | 438/616 |

OTHER PUBLICATIONS

U.S. Appl. No. 11/625,449, filed Jan. 22, 2007 titled "Techniques for Forming Interconnects" of Danovitch et al.

* cited by examiner

*Primary Examiner* — Angel Roman
(74) *Attorney, Agent, or Firm* — Ryan, Mason & Lewis, LLP

(57) ABSTRACT

Interconnects are formed on attachment points of a wafer by performing several steps. A plurality of cavities having a predetermined shape is formed in a semiconductor substrate. These cavities are then filled with an interconnect material to form the interconnects. The interconnects are subsequently attached to the attachment points of the wafer.

2 Claims, 4 Drawing Sheets

TECHNIQUES FOR FORMING SOLDER BUMP INTERCONNECTS

CROSS-REFERENCE TO RELATED APPLICATIONS

This application is a divisional of U.S. patent application Ser. No. 11/856,831, filed Sep. 18, 2007 now U.S. Pat. No. 8,148,255, incorporated by reference herein.

FIELD OF THE INVENTION

The present invention generally relates to the electrical and electronic arts and, more particularly, to formation of interconnects for circuits and the like.

BACKGROUND OF THE INVENTION

Silicon chips are built on silicon wafers and diced into chips. Known interconnection techniques include wire bonding and so-called flip chip or area array techniques, also known as C4 (controlled collapse chip connection). For flip chips, an array of solder bump interconnects is formed on a wafer before the wafer is diced into a multiplicity of discrete chips. The solder bump interconnects may be formed by plating the back side of the wafer through a resist layer. Plating is chemically dependent and can be difficult to control for complex solders. Plating has been used for high melting point solder (e.g., 97% lead, 3% tin) and can be used for some lead-free solders desirable for environmental reasons (e.g., tin-copper or tin-copper-silver). However control of exact solder composition for some lead free solders can be difficult or impossible to achieve with good solder composition uniformity and repeatability. Injection molded solder (IMS) is preferred for such materials. An injector head is employed over the top of a glass mold with cavities. Molten solder flows into the cavities and a small amount of solder is left behind. When reflowed, the molten solder in the cavities tends to assume spherical shapes, which can be transferred to the wafer by joining the wafer to the mold in a mirror-image fashion.

Additional details of IMS processes are described in, for example, P. A. Gruber et al., "Low-cost wafer bumping," IBM Journal of Research and Development. Volume 49. Number 4/5, July/September 2005, pp. 621-639, which is incorporated by reference herein.

The integration of multiple flip chips onto a single silicon carrier has recently gained popularity because of the ability of such assemblies to achieve higher system performances. FIG. 1 shows an example of such a multi-chip assembly 100. This assembly comprises two flip chips 110 that are bonded face-down to a single silicon chip carrier 120 via a multiplicity of chip-to-carrier solder bump interconnects 130. The silicon chip carrier, in turn, comprises its own high density wiring 140 and larger C4 connectors 150. Pitches for the chip-to-carrier solder bump interconnects in multi-chip assemblies are presently about 150-200 μm. Nevertheless, pitches as small as 5-10 μm are predicted for the future. As a result, IMS processes compatible with these smaller pitches are presently undergoing intensive research.

This research has determined that, despite the fact that glass molds have been utilized successfully with IMS processes in present-day chip-to-carrier solder bump interconnect pitches, IMS processes using glass molds may not be easily scalable to smaller pitches (e.g., pitches less than about 150 μm). The cavities in a glass mold are typically formed by performing a wet chemical etching process on a glass substrate through small openings in an etch mask. Unfortunately, such processing may have several disadvantages at smaller pitches. Wet chemical etching in glass, for example, may suffer from uniformity issues mold-to-mold and across a given mold. As a result, different cavities on different glass molds, or even on the same glass mold, may have different volumes, which, in turn, results in solder bump interconnects of varying sizes. In addition, wet chemical etching tends to form cavities in glass molds with a non-ideal shape. FIG. 2 shows a cavity 210 in a glass mold 220 with an etch mask 230 still in place. Because of the isotropic nature of the wet chemical etching, a cavity is typically formed with a shallow bowl shape that is 2-3 times as wide as it is deep. This, in turn, may cause transfer issues when attempting to transfer solder bumps from the glass mold to the wafer. In FIG. 3, a solder bump 310 has become offset from the center of its cavity 320 while attempting to transfer it from a glass mold 330 to a bond pad 340 of a wafer 350. With this offset, the transfer is not likely to occur.

Accordingly, it would be desirable to overcome the limitations of the prior art approaches.

SUMMARY OF THE INVENTION

Embodiments of the present invention address the above-identified need by providing semiconductor molds for use in IMS processing. These semiconductor molds may have several advantages over conventional glass molds. The cavities in semiconductor molds may take on several different shapes whose characteristics may be very precisely controlled. Moreover, semiconductor molds may be formed using conventional and readily available semiconductor processing techniques.

In accordance with an aspect of the invention, interconnects are formed on attachment points of a wafer by performing several steps. A plurality of cavities having a predetermined shape is formed in a semiconductor substrate. These cavities are then filled with an interconnect material to form the interconnects. The interconnects are subsequently attached to the attachment points of the wafer.

In accordance with one of the above-identified embodiment of the invention, a multiplicity of pyramidal or trench-shaped cavities is formed in a circular silicon wafer using conventional semiconductor processing techniques such as photolithography, wet chemical etching, and reactive ion etching. The silicon wafer is then diced to form a square-shaped semiconductor mold for use in forming solder bump interconnects by IMS processing.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1:
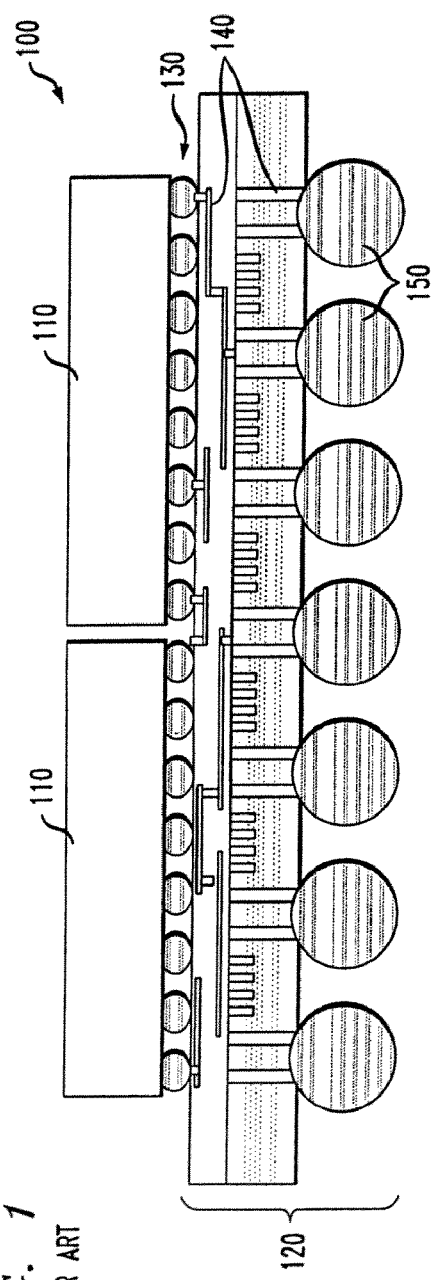
FIG. 1 shows a sectional view of flip chips bonded to a chip carrier.
Figure 2:
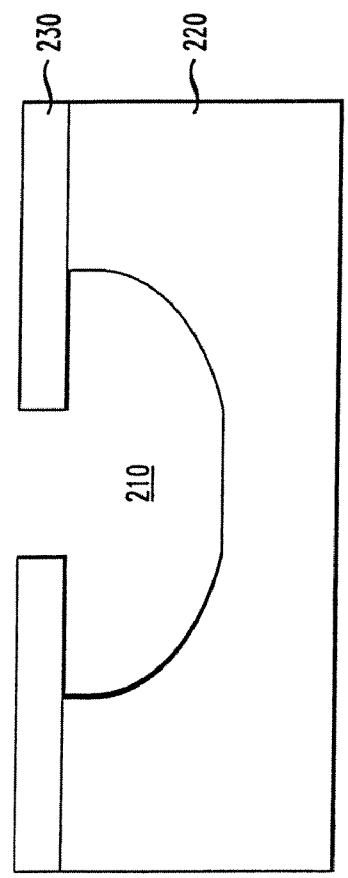
FIG. 2 shows a sectional view of a cavity in a glass mold.
Figure 3:
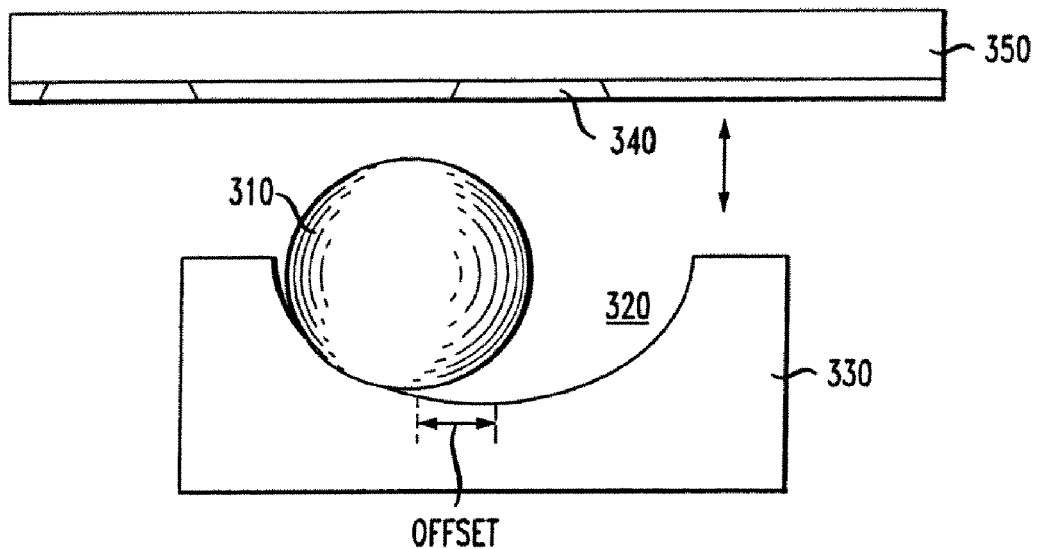
FIG. 3 shows a sectional view of a wafer and a solder bump on a glass mold.
Figure 4:
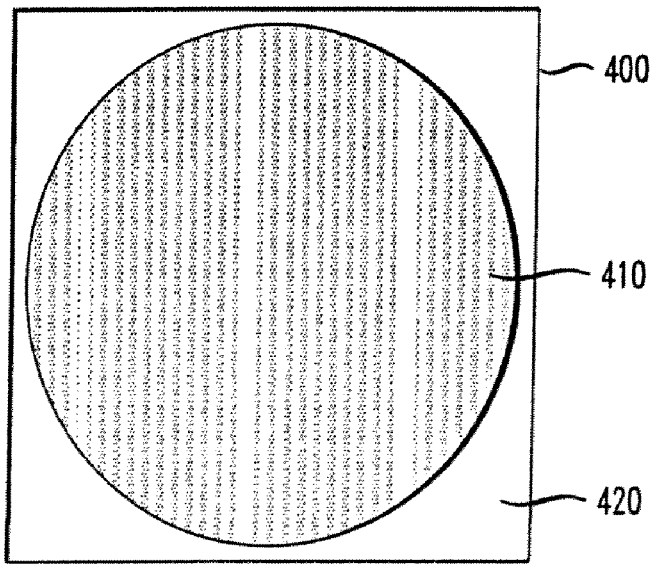
FIG. 4 shows a plan view of a semiconductor mold in accordance with an illustrative embodiment of the invention.

FIG. 4 shows a plan view of a semiconductor mold 400 in accordance with an illustrative embodiment of the invention. The semiconductor mold is substantially square in shape. Furthermore, it has two regions, a processed inner region 410 with a circular shape and an outer unprocessed region 420.

The semiconductor mold 400 may be formed from a substrate comprising silicon or any other suitable semiconductor material (e.g., gallium arsenide). Like a glass mold, the semiconductor mold is adapted to be utilized to transfer solder bump interconnects to a wafer (hereinafter called the "transferee wafer") before the transferee wafer is diced into discrete flip chips. For this reason, the processed inner region 410 of the semiconductor mold preferably has a diameter substantially identical to that of the transferee wafer (e.g., 200 mm or 300 mm). Moreover, the processed inner region comprises a multiplicity of cavities arranged in a pattern which describes a mirror-image of the desired pattern of solder bump interconnects on the transferee wafer.

Advantageously, the actual formation of solder bump interconnects and the transfer of these interconnects to the transferee wafer using the semiconductor mold 400 are substantially similar to solder bump formation and transfer when using glass molds. As a result, these processing steps will be familiar to one skilled in the art. Briefly, after forming the semiconductor mold (described in greater detail below), the cavities in the mold are filled with molten solder. To accomplish this, the semiconductor mold is passed below an injector head. The injector head includes a reservoir of solder and a solder slot that is typically at least as wide as the diameter of the transferee wafer. As the solder mold is passed below the solder slot, the injector head utilizes a pressure above ambient pressure to push molten solder from the reservoir into the solder slot and subsequently into the rows of cavities in the semiconductor mold.

Because the injector head is pressurized, the injector head needs to provide a pressure seal with the semiconductor mold 400 such that the molten solder under pressure can easily flow into the mold's cavities as the mold is scanned under the head without leaking beyond the solder slot area. Unlike solder paste, which has a very high viscosity, the viscosity of molten solder is only about two centipoises, or twice that of water. Consequently, micron-sized leaks in the pressure seal may produce solder bridges between adjacent filled cavities, while larger defects may purge the solder reservoir in seconds, leaving a puddle of molten solder on the semiconductor mold. Nevertheless, sliding pressure seals may be effectively accomplished with a compliant seal mechanism such as a rubber o-ring between the bottom of the solder slot and the surface of the mold. The compliant seal mechanism accommodates the shape of the semiconductor mold, which may not be perfectly flat.

Once the cavities in the semiconductor mold 400 are filled with solder, the semiconductor mold can be precisely aligned with and mechanically joined to the transferee wafer. The assembly is then placed in a reflow furnace with a temperature profile selected to provide a temperature above the solder melting point for a desired amount of time. This causes the solder in the cavities to melt and surface tension forces the molten solder volume against the bond pads of the wafer, causing a metallurgical bond to form. As the assembly is cooled, the solder volumes in the cavities again solidify but are now strongly bonded to the wafer and only weakly attached to the cavity walls. The semiconductor mold and transferee wafer may then be separated in order to finish the transfer of the solder bump interconnects to the transferee wafer.

Figure 5A:
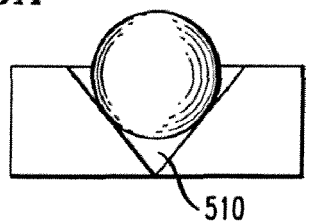
FIGS. 5A-5C show sectional views of alternative cavity shapes for the FIG. 4 semiconductor mold.
Figure 5B:
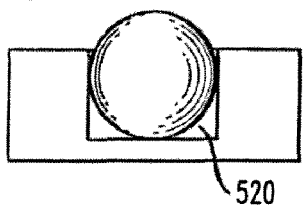
Figure 5C:
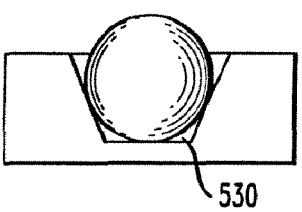

FIGS. 5A-5C show sectional views of three illustrative cavities, 510, 520, and 530, respectively, with different shapes which may be utilized in the semiconductor mold 400. Advantageously, each one of these shapes causes its respective solder bump interconnect to be held firmly centered in its cavity when being transferred to the transferee wafer. The problems of solder bump offset found in glass mold plates are thereby mitigated. Moreover, each one of the cavity shapes is capable of being formed with processing techniques that tend to be extremely uniform and reproducible as well as being widely available in existing semiconductor fabrication plants, particularly when utilizing crystalline silicon substrates to form the semiconductor molds.

The cavity 510 shown in FIG. 5A, for example, is pyramidal in shape. Cavities like the cavity 510 can be readily formed in a crystalline silicon substrate with a surface having a substantially <100> crystal plane orientation. Initially, a photoresist mask is formed over the <100> surface and conventional photolithography techniques are used to define an opening of the desired shape and size over the region of the substrate where the cavity is intended. Then, with the developed photoresist mask in place, the film stack is exposed to an anisotropic etch process. Such an anisotropic etch process relies on the fact that certain etchants tend to etch different crystal planes of crystalline silicon at substantially different etch rates. For example, potassium hydroxide (KOH) etches the <100> crystal plane of silicon about 400 times faster than it etches the <111> crystal plane. As a result, the present anisotropic etch process may be accomplished by exposing the silicon substrate to a solution comprising KOH, such as a solution of KOH, ethylene glycol, and water. As an alternative to KOH, ethylene diamine pyrocatechol may be used to selectively etch silicon. In addition there are several other selective etchants for crystalline silicon that will be known to one skilled in the art.

The resultant cavity has characteristic oblique faces having substantially <111> crystal plane orientations. These oblique faces tend to be angled by about 55 degrees in relation to the remaining <100> surfaces of the silicon substrate. The depth of the cavity may be controlled by simply timing the anisotropic etch process. Also, such an anisotropic etch may be substantially self-limiting, again helping to assure cavities with uniform volumes.

Figure 6:
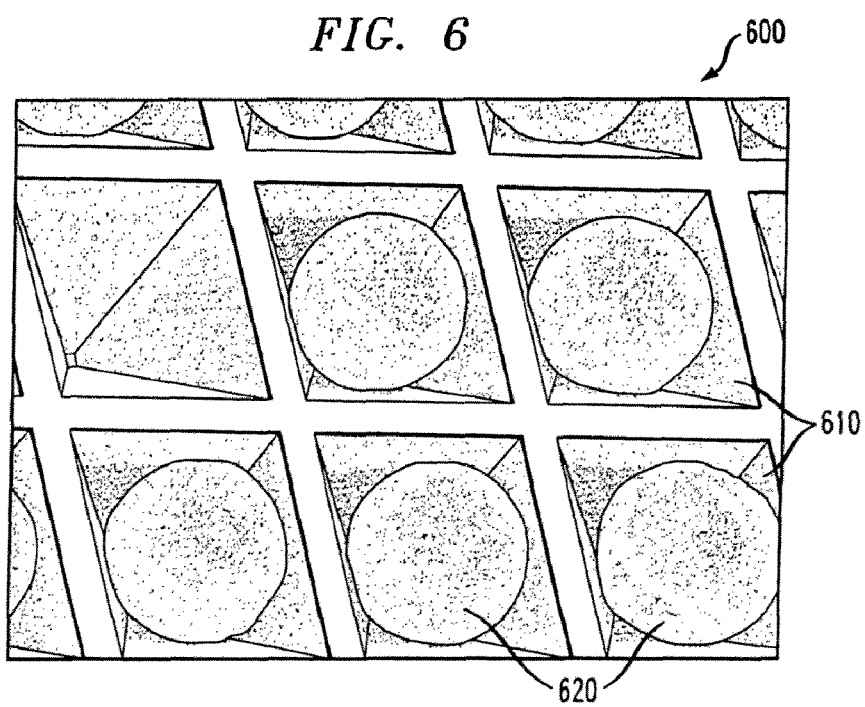
FIG. 6 shows a perspective view of a portion of the FIG. 4 semiconductor mold with pyramidal cavities.

FIG. 6 shows a perspective view of a portion of a semiconductor mold 600 with pyramidal cavities 610 like the cavity 510 in FIG. 5A. Solder bump interconnects 620 fill several of the cavities. Notably, this figure is a drawn representation of an actual scanning electron microscope (SEM) image of a silicon-based semiconductor mold processed using an anisotropic etching technique like that described above.

The cavities 520, 530 in FIGS. 5B and 5C, in contrast, are trench-shaped. However, these cavities differ from one another in that the cavity 520 in FIG. 5B has substantially vertical sidewalls (i.e., the sidewalls of the trench are substantially vertical in the up-down direction of the figure), while the cavity 530 in FIG. 5C has tapered sidewalls (i.e., the sidewalls of the trench are angled in relation to the up-down direction of the figure). The cavities 520, 530 are preferably circular or square when considered top down, but may also take on other shapes (e.g., they may be rectangular, hexagonal, octagonal, etc.).

The formation of trench-shaped cavities like the cavities 520, 530 in semiconductor substrates is quite routine in semiconductor processing and, therefore, will be familiar to one skilled in the art. The size, shape, and position of a cavity may be initially defined by patterning an opening in a photoresist mask over the desired position of a cavity using conventional photolithography techniques. Then, with the developed photoresist mask in place, an anisotropic etching technique such as reactive ion etching (RIE) may be used to pattern the actual cavity into the substrate. If the semiconductor substrate comprises silicon, for example, good results may be produced by using haloflourocarbon gases such as $CF_3Cl$, $CF_3Br$, and $CF_2Cl_2$ in combination with $NF_3$, or by using $CHCl_3$ in combination with $O_2$ and $N_2$. The taper angle of the sidewalls of the cavities typically depends on the amount of polymerized material that deposits on the trench sidewalls during the etch. Typically, the higher the concentration of reactive carbon, the greater the amount of polymerized material that deposits on the sidewalls of the cavity during the etch process and the greater the amount of sidewall taper. Therefore, by manipulating reactants and process parameters, one skilled in the art will be able to readily tailor a silicon RIE process to reproducibly yield sidewalls that are tapered or vertical.

It is emphasized that the methods for forming the cavities described above are merely illustrative and that the scope of the invention is not limited to these precise methods. Several alternative methods for forming cavities in semiconductor substrates are available and will be apparent to one skilled in the art. An alternative method for forming cavities in a semiconductor substrate may comprise, for example, laser drilling (also called "laser etching"). Such a method uses a laser to thermally etch material from the substrate. Laser drilling of silicon is used extensively, for example, in the micromachining of silicon to form vias for 3D interconnects. Laser drilling tools are commercially available from, for instance, XSiL Ltd. of Dublin, Ireland and Oxford Lasers Ltd. of Oxon, UK.

After forming cavities in the silicon mold 400, the cavities and the uppermost surface of the mold may optionally be coated with a layer of conformal material, such as, but not limited to a dielectric material like silicon oxide or silicon nitride. It has been observed with glass molds that cavities may have sharp edges which may cause damage to the compliant seal mechanisms (e.g., rubber o-rings) of injector heads when applying molten solder to the molds. Depositing a conformal material on top of the semiconductor mold tends to smooth (e.g., 1-3 micrometer radius) any such sharp edges and substantially increase the lifetime of injector heads used with that mold. A layer of conformal material may be deposited on the semiconductor mold by, for example, conventional chemical vapor deposition or physical vapor deposition.

It will be again noted that the semiconductor mold 400 in FIG. 4 has a square shape when considered top down (i.e. as shown in the figure). A square shape is preferred over a circular shape (like a wafer) because a square shape allows the mold to pass under the solder slot of the injector head when applying molten solder to the mold without the pressurized solder slot falling off of the edges of the mold. Nevertheless, many of the processing tools available in existing semiconductor fabrication plants are adapted to exclusively process circular wafers. In other words, they are not typically capable of processing semiconductor substrates with non-circular shapes.

Figure 7A:
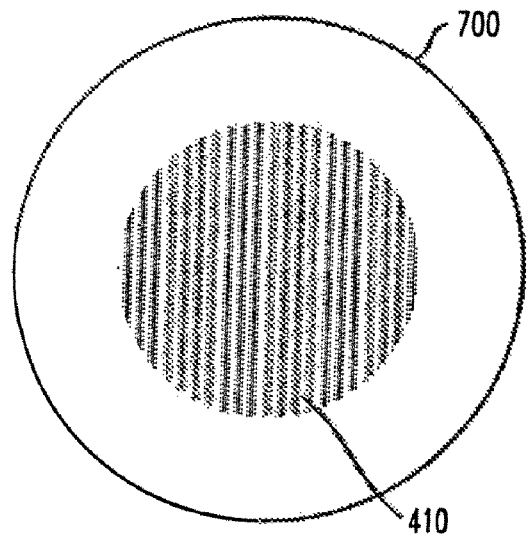
FIGS. 7A-7B show plan views of a circular semiconductor wafer and its conversion into the FIG. 4 semiconductor mold.
Figure 7B:
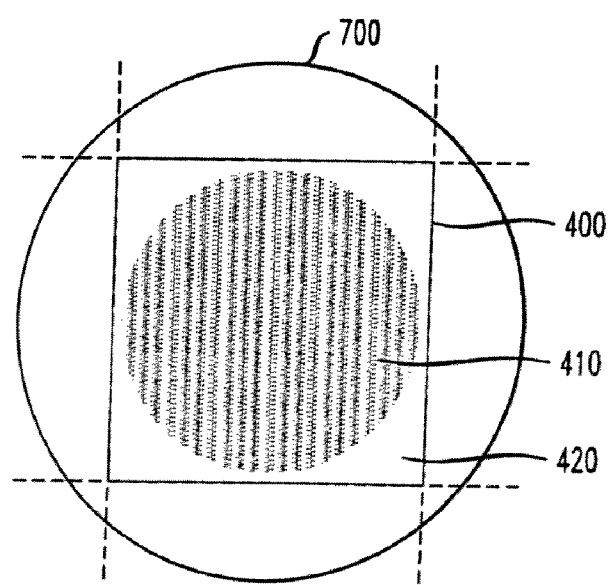

As a result, it becomes advantageous to be able to form the semiconductor mold 400 from a semiconductor, wafer (hereinafter, the "mold substrate wafer"). FIGS. 7A and 7B show a plan view of a mold substrate wafer 700 and its conversion into the square semiconductor mold 400. As shown in FIG. 7A, cavities are initially formed in the inner region of the mold substrate wafer using readily available semiconductor processing equipment, thereby forming the processed inner region 410 of the eventual semiconductor mold. A conformal material is then optionally deposited on the mold substrate wafer, as detailed above. After this is completed, the mold substrate wafer is diced into a square shape, to form the final semiconductor mold 400, as shown in FIG. 7B. Of course, when using such a method, the mold substrate wafer must have a substantially larger diameter than the intended transferee wafer. A 300 mm diameter mold substrate wafer could, for example, be used to form a semiconductor mold adapted to form solder bump interconnects on a 200 mm diameter transferee wafer.

Alternatively, the semiconductor mold 400 may simply be formed from a substrate of the same shape and size as the semiconductor mold, thereby foregoing the need to dice the substrate after forming cavities. It is well-known that semiconductor substrates may be cast into varying shapes including squares. Such a cast semiconductor substrate, may, for example, be processed by laser drilling to form the semiconductor mold.

It is noted that if a semiconductor mold processed from a mold substrate wafer or cast semiconductor substrate is deemed too structurally weak to stand up to multiple IMS processes, it may be beneficial to reinforce the mold by adding a reinforcing structure to the back of the mold. It may, for example, be advantageous to adhere a second layer of semiconductor substrate material or other suitable material to the back of the semiconductor mold before the mold is utilized for IMS processing. The use of such a reinforcing structure is likely to substantially prolong the useful lifetime of the semiconductor mold and to supply the semiconductor molded with added rigidity.

The techniques set forth herein can be used to make circuits realized on an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either: (a) an intermediate product, such as a mother board, or (b) an end product. The end product can be any product that includes integrated circuit chips, ranging from toys and other low-end or consumer electronic applications to advanced computer products. The techniques set forth herein can be used for interconnecting the chip on chips or chip stacks for 3D applications, chips on wafers, chips on package, or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A mold for forming interconnects onto attachment points of a wafer, the mold comprising a semiconductor substrate having a plurality of cavities with a predetermined shape, wherein the predetermined shape of the plurality of cavities has more than four walls that terminate in a substantially symmetric bottom and that substantially center each of the interconnects in an associated one of the plurality of cavities, and the mold adapted to have the plurality of cavities filled with interconnect material to form the interconnects such that the interconnects can be attached the attachment points of the wafer.

2. The mold of claim 1, wherein the mold is formed from a semiconductor wafer.

* * * * *